United States Patent
Kydd

(10) Patent No.: US 6,824,603 B1
(45) Date of Patent: Nov. 30, 2004

(54) COMPOSITION AND METHOD FOR PRINTING RESISTORS, CAPACITORS AND INDUCTORS

(75) Inventor: Paul H. Kydd, Lawrencville, NJ (US)

(73) Assignee: Parelec, Inc., Rocky Hill, NJ (US)

( * ) Notice: Subject to any disclaimer, the term of this patent is extended or adjusted under 35 U.S.C. 154(b) by 0 days.

(21) Appl. No.: 10/258,160

(22) PCT Filed: Apr. 20, 2000

(86) PCT No.: PCT/US00/10618
§ 371 (c)(1),
(2), (4) Date: Oct. 18, 2002

(87) PCT Pub. No.: WO01/82315
PCT Pub. Date: Nov. 1, 2001

(51) Int. Cl.$^7$ .......................... H01G 4/10; C04B 35/01; C09D 11/00; H01C 17/065; H01C 13/00

(52) U.S. Cl. .......................... 106/287.35; 106/287.17; 106/287.18; 106/287.19; 106/287.23; 106/287.28; 106/287.29; 106/287.3; 106/287.34; 252/512; 252/513; 252/514; 252/519.3; 252/520.3; 361/270; 361/321.5; 361/332; 428/417; 428/473.5; 428/702; 427/79; 427/80; 427/96; 427/102; 427/126.2; 427/126.3; 427/126.4; 427/126.5; 427/126.6; 427/226; 101/491

(58) Field of Search .................. 252/512, 513, 252/514, 519.3, 520.3; 427/79, 96, 102, 126.3, 80, 126.2, 126.4, 126.5, 126.6, 226; 428/417, 473.5, 702; 361/270, 332, 321.5; 101/491; 106/287.17, 287.18, 287.19, 287.23, 287.28, 287.29, 287.3, 287.34, 287.35

(56) References Cited

U.S. PATENT DOCUMENTS

| | | | | |
|---|---|---|---|---|
| 5,882,722 A | * | 3/1999 | Kydd | 427/96 |
| 6,036,889 A | * | 3/2000 | Kydd | 252/512 |
| 6,143,356 A | * | 11/2000 | Jablonski | 427/96 |
| 6,361,912 B2 | * | 3/2002 | Fonash et al. | 430/52 |
| 6,379,745 B1 | * | 4/2002 | Kydd et al. | 427/96 |

* cited by examiner

Primary Examiner—David Brunsman
(74) Attorney, Agent, or Firm—Synnestvedt Lechner & Woodbridge, LLP; Richard C. Woodbridge, Esq.; Stuart H. Nissim, Esq.

(57) ABSTRACT

A composition of matter comprising a mixture of an oxide powder or powders and a Reactive Organic Medium (ROM) which can be used to create electronic components on a suitable. The materials are applied to conventional polymer-based circuit substrates by any convenient printing process and thermally cured to well-consolidated oxide components at a temperature, which the substrate can withstand. Mixtures for various components, including resistors, capacitor dielectrics and magnetic cores and processes to apply them are disclosed.

18 Claims, No Drawings

COMPOSITION AND METHOD FOR PRINTING RESISTORS, CAPACITORS AND INDUCTORS

This application is a 371 of PCT/US00/10618 filed Apr. 20, 2000.

FIELD OF THE INVENTION

The invention relates to the production of electronic circuits, more particularly to V compositions and processes for the production of passive components such as resistors, capacitors and inductors for rigid and flexible printed circuits on polymer-based substrates using print-and-heat technology

BACKGROUND

Electric resistors, capacitors and inductors are now almost uniformly produced with oxide ceramic active elements, even for discrete components, which are assembled to circuits by soldering. Examples of such materials include: silver-palladium oxide resistors; ruthenium oxide resistors; barium ruthenate resistors; barium titanate ferroelectric capacitors and piezoelectric elements; lead titanateizirconate ferroelectrics; spinel-type ferrites such as magnetite; hexaferrites; and gamet-type ferrites.

Passive electronic components such as capacitors and resistors have been prepared on substrates by printing "Dick film" inks on ceramic substrates to make "hybrid circuits" for many years. Thick film inks and pastes consist of a suspension of particulate material with the desired electrical properties in an organic vehicle. The vehicle consists of a viscous liquid such as a-terpinol with a resin such as ethyl cellulose for viscosity modifications and minor additions of other constituents to improve printability. Glass frit is added to the mixture to improve bondability to the substrate. A hybrid circuit consists of metallic circuit traces, screen printed on ceramic substrates and fired at temperatures in the neighborhood of 1000° C. to sinter the metal and fuse the glass to bond the metal and the ceramic. During the firing process, the organic constituents of the inks volatilize and disappear. Their function is strictly to facilitate printing. Silicon integrated circuits are usually bonded to the traces creating a hybrid between the silicon circuitry and the ceramic circuitry.

Thick film resistor inks can be used to print resistors rather than bonding discrete components to the circuit. Silver-palladium mixtures, which can be oxidized to silver-palladium metal and semiconducting palladium oxide, have been widely used as resistive films as described by Larry, J. R; Rosenberg, R. M.; Uhier, R. O.; in Trans IEEE, CHMT-3, (2), 211–225, 1980. In recent years semiconducting ruthenium oxide compositions have become dominant.

Thick film capacitors have been prepared by printing a metallic plate, printing a layer of thick film ferroelectric dielectric, such as barium titanate, and printing another metallic plate to complete the capacitor. At high temperature the barium titanate sinters into monolithic ceramic and grain growth occurs, improving its dielectric properties.

Ferrite inductive cores for transformers, chokes and antennas can be printed with inks containing ferrite particles, which sinter to monolithic ceramics at the high processing temperatures of thick film technology.

"Polymer Thick Film" materials are widely used to print silver conductive traces on polymer substrates such as membrane touch switches and keyboards. These "polymer thick film" materials are similar to conventional thick film inks, except the organic vehicle is an epoxy resin which is not volatilized and remains as an integral part of the finished circuit component. The electrical conductivity of these materials is less than one tenth that of conventional thick film conductors because the conductivity depends on adventitious contact between the individual silver flakes in the epoxy matrix rather than on the monolithic sintered structure achieved in high temperature thick film processing. There have been attempts to create polymer thick film capacitor dielectrics and inductive cores, however; these problems are even more severe in these materials which depend for their electrical properties on the creation of void-free recrystalized structures. Since the particles are isolated by organic matrix, even though each particle in the polymer thick film ink may have a high dielectric constant or magnetic permeability, the properties of the deposit are closer to those of the matrix than to those of the particles.

A new class of compositions now known as Parmod™ have been used in a low temperature process for producing high conductivity electrical conductors on temperature sensitive substrates. Examples of such Parmod™ compositions are disclosed in U.S. Pat. No. 5,882,722 (the disclosures of which are here by incorporated in full by reference hereto) and U.S. application Ser. Nos. 09/034,069; 09/484,882; and 09/367,783 (the disclosures of which are here by incorporated in full by reference hereto). Such Parmod™ compositions contain a Reactive Organic Medium (ROM) and metal flakes and/or metal powders. The ROM consists of either a Metallo-Organic Decomposition (MOD) compound or an organic reagent, which can form such a MOD compound upon heating in the presence of the metal constituents. The ingredients are blended together with rheology modifying organic vehicles well known in the art, if necessary, to produce printing inks or pastes. These inks can be printed on a temperature sensitive substrate and cured to well-consolidated, well-bonded electrical conductors at a temperature low enough so that the substrate is not damaged. The curing process occurs at temperatures far below those used for conventional sintering of thick film inks and pastes. Parmod™ compositions can also be formulated into liquid toners capable of being printed using electrostatic printing methods. Examples of such toners are disclosed in U.S. application Ser. No. 09/369,571 (the disclosure of which is hereby incorporated in full by reference hereto).

A major application of these Parmod™ materials is producing printed circuits by a fully additive process in which the Parmod™ mixtures are printed on the polymer-based circuit substrate and cured to well-bonded, pure metal conductors by heating to a temperature in a range that the substrate can stand, for example, about 200–350° C. This process eliminates the steps of laminating copper to the substrate, laminating a photoresist to the copper, exposing the resist through a mask, developing the resist, etching away the unwanted copper and stripping the resist that comprise conventional subtractive processing.

The Parmod™ process and materials make use of the unexpected property that mixtures of metal powders with metal-containing reactive organic materials can be decomposed to well-consolidated metal traces in which the metal particles appear to be "chemically welded" together into a continuous metallic phase. This chemical process takes place at temperatures that are hundreds of degrees lower than those required for conventional metallic sintering, and in times that can be measured in seconds rather than minutes or hours. The result is the ability to produce the equivalent of "thick film" circuits which are produced by screen printing sinterable metallic pastes on ceramic substrates and firing at temperatures of 500° C. to more than 1000° C., but to do it on much less expensive polymer-based substrates and cure them in much less time at much lower temperatures. In the case of metals this results in a porous but continuous metal trace which has a density approximately half that of bulk metal and an electrical conductivity per unit mass which is also approximately half that of the bulk metal. The printed Parmod™ conductors are made up of continuous well-bonded metal rather than individual particles, which are in adventitious contact with each other. "polymer thick film materials", which consist of silver flakes in an epoxy continuous phase, have an electrical conductivity based on mass of approximately one tenth that of Parmod™.

It would be desirable to be able to print resistors, capacitors and inductors on to low temperature substrates and fire them prior to or simultaneously with the metallic conductors at the low temperatures achievable with Parmod™ technology It is an objective of this invention to provide inks and pastes which will decompose to form electrical components such as resistors, capacitors and inductors at a low enough temperature to be used on conventional polymer-based printed circuit boards like polymer thick film materials, but which have the good electrical properties of conventional high temperature thick film materials.

SUMMARY OF THE INVENTION

Parmod™ technology is used to create continuous oxide phases from printable inks and pastes by mixing high performance powders with a reactive organic medium, which can weld them together into a continuous phase at low temperature by decomposing into the same chemical composition as the powder phase.

The Parmod™ mixtures of this invention function by deposition of material from the decomposition of the MOD compound which "chemically welds" the powder constituents of the mixture together into a monolithic solid.

The resulting passive components can be produced and connected as part of the printed circuit fabrication process, rather than being separately produced and assembled onto the printed circuit by soldering.

DETAILED DESCRIPTION OF THE INVENTION

Thick film circuits typically contain oxide resistors, capacitors and inductors that are printed on ceramic substrates and fired prior to or simultaneously with the metallic conductors. It would be desirable to extend Parmod™ technology to print nonmetallic oxide materials with electrically useful properties on polymer substrates. The present invention combines an oxide powder or powders with the appropriate electrical properties with a reactive organic medium (ROM) which produces additional oxide to bond the powder into a continuous phase, resulting in compositions having superior performance. The performance of Parmod™ oxides of the present invention are better than mixtures of active powders with organic binders which are available for ferroelectric capacitors and ferrite inductors. The performance of polymer blends of high dielectric constant (high K) dielectrics and high permeability ferrites suffer also because even though the powders may have high electrical performance the inactive organic interface between powder particles dominates the properties of the blend. Thus barium titanate dielectric powder with a dielectric constant in the thousands produces a polymer blend with a dielectric constant of 60 as a maximum. The properties of ferrite inductors are similarly dependent on the existence of continuous magnetic pathways through the material.

Parmod™ technology is applied to oxides of metals to accomplish the objective of producing a continuous solid phase of high electrical performance by printing and heating an ink or paste. ROMs exist for many elements, and most of them deposit oxides when decomposed in air. Heretofore, the main problem has been to prevent oxidation when depositing metallic conductors of copper and other metals. The present application has to do with mixtures of oxide powders with a ROM, which will deposit additional oxide to weld the powder particles together into a monolithic solid with desirable electrical properties.

Silver-Palladium Oxide Resistors

Silver-palladium oxide resistive mixtures are a standard in thick film technology for achieving resistivity values of a few tens to a few tens of thousands of ohms per square. Higher resistance can be achieved by printing serpentine patterns. Silver-palladium resistors function by forming a network of silver-palladium particles coated with silver oxide, which conduct very well, separated by a film of semiconducting palladium oxide which conducts poorly. The proportions of the two metals and the oxygen content of the finished film determine the resistivity. The oxygen content is controlled by the firing conditions of temperature and time in an air atmosphere.

The following Metallo-Organic Decomposition (MOD) compounds were synthesized as constituents of the Reactive Organic Medium for preparing Parmod™ silver palladium inks:

| | |
|---|---|
| silver neodecanoate | Ag(nd) |
| palladium 2-ethylhexanoate | Pd(eh)$_2$ |
| Manganese neodecanoate | Mn(nd)$_2$ |

Examples of silver palladium resistor ink formulations were prepared for as shown in Table 1.

TABLE 1

Silver/Palladium/Palladium Oxide Ink Compositions

| | | | | MODs | | Carrier |
|---|---|---|---|---|---|---|
| Ink | *Ag powder | **Pd powder | ***PdO powder | Ag (nd) | Pd(2EH)2 | solvent (NDA) |
| Sample 1 20 wt % Pd | B) 2 g | B) 0.55 g | | 0.5 g | | 0.5 g |
| Sample 2 50 wt % Pd | C) 2.0 g | B) 2.19 g | | 0.5 g | | 0.75 g |
| Sample 3 53.5 wt % PdO (50 wt % Pd) | C) 2.0 g | | A) 2.52 g | 0.5 g | | 0.75 g |
| Sample 4 74.1 wt % PdO (80 wt % Pd) | C) 0.61 g | | A) 4.60 g | 1.0 g | | 0.6 g |
| Sample 5 92.2 wt % PdO (91.1 wt % Pd) | | | A) 4.60 g | 1.0 g | | 0.6 g |

TABLE 1-continued

Silver/Palladium/Palladium Oxide Ink Compositions

| Ink | *Ag powder | **Pd powder | ***PdO powder | Ag (nd) | MODs Pd(2EH)2 | Carrier solvent (NDA) |
|---|---|---|---|---|---|---|
| Sample 6 85.5 wt % PdO (83.7 wt % Pd) | C) 0.61 g | | A) 4.60 g | 0.5 g | 0.5 g | 0.6 g |
| Sample 7 96.1 wt % PdO (95.5 wt % Pd) | | | A) 4.60 g | 0.5 g | 0.5 g | 0.6 g |
| Sample 8 75% PdO | C) 1.13 g | | A) 3.39 g | | Mn(nd)$_2$ 0.5 g | 0.30 g |

Ag powders: A) Alfa, 0.7–1.3 μm; B) Aldrich, nanosize activated; C) Degussa, 0.32 μm; D)Degussa silver flake
**Pd powders: A) Aldrich, 1.0–1.5 μm; B) Aldrich, submicron.
***PdO powder: A) Degussa, 0.95 μm.

The inks were prepared by weighing out the powder constituents individually and adding the indicated amount of MOD compound(s) and neodecanoic acid (NDA). The mixture was blended by hand to obtain a smooth, screen printable ink.

A quartz tube furnace was fitted with an Illinois Instruments Oxygen Analyzer Model 6000 to provide well-controlled atmospheric compositions for curing resistor inks. Several formulations of Ag/Pd/PdO Parmod™ type inks were made by varying the silver to palladium ratios, the silver, palladium, and palladium oxide powder particle sizes, and the metallo-organic decomposition (MOD) compound ratios. Experiments using various heating and atmospheric conditions have yielded insight into the effects that the constituents have on the final electrical properties of the cured film.

Silver:Palladium:Palladium Oxide Ratios

The ability of the silver Parmod™ to consolidate into well-bonded traces is much greater than that of palladium. Certain amounts of silver powder and silver neodecanoate were used to provide good consolidation of the resulting film.

The ratio of silver to palladium or palladium oxide has an effect on the electrical resistivity, as shown in FIG. 1. In general, as the palladium or palladium oxide concentration is increased, the resistivity increases. The amount of silver can be limited in order to get high resistivities, but this has to be balanced with the consolidation ability of the ink composition. A high achievable resistivity brings these mixtures into the desired range at 25 ohms per square at 25 microns (0.001-inch) thickness.

A preferred range of silver to palladium is 0.05:1 to 1:1. This range produces a range of desired resistivity of 0.0001 ohm cm to 0.25 ohm cm or 0.4 to 100 ohm per square at a desired thickness of 0.0025 cm (1 mil)±50%.

Atmosphere Effects

Oxygen concentration of the curing atmosphere can be used to control the resistivity of the resistor film. A higher oxygen partial pressure promotes oxidation of the palladium and provides a higher resistivity. When palladium oxide powder was used rather than palladium metal powder, as in inks Sample 3, 4, 5, 6 and 7 (Table 1), the atmosphere effect is in the expected direction—higher oxygen concentration results in an increase of resistivity. This effect is shown in FIG. 2.

Temperature Effects

Longer curing times and higher temperatures result in more oxidation and therefore higher resistivities. When palladium MOD was substituted for half of the silver MOD, the resistive ink shows an increase in resistivity when processed at increasing temperature in air as shown in FIG. 2. FIGS. 1 and 2 show Parmod™ silver-palladium resistor exhibit useable resistivity values.

Addition of Mn MOD to Increase Resistivity

The use of PdO increased the resistivity of Ag/Pd resistor compositions, but with the silver MOD producing the binding matrix, the resistivity can remain low. Adding a metal that can bind the Ag and PdO particles into a film and has a much higher resistivity will further increase resistivity. The resistivity of manganese metal is 144 μΩ-cm compared to 1.6 μΩ-cm for silver. We have shown that the manganese MOD works well with silver to form well consolidated films. Using manganese neodecanoate as the MOD "cement" to hold the silver and PdO particles together creates a much less conductive binding matrix. It also creates the possibility of resistivity variability, since the resistivity of the binding matrix can be controlled by varying the ratio of the silver and manganese MOD compounds in the ink.

Several inks were formulated and tested. The formulations included using the manganese MOD alone to stick together various ratios of silver and palladium oxide particles and a combination of the manganese MOD and silver MOD with the silver and palladium oxide particles. Ink Sample 8 (Table 1) was made containing 75% PdO powder (25% Ag powder) and only the Mn MOD. This ink had fair consolidation. When cured at 350° C. in air the resistivity was 21 ohms per square per mil.

Ruthenate Resistors

Most modem thick film resistive materials are based on ruthenium oxide or barium ruthenate. The advantage is a greater range of resistivity, better reproducibility of resistance value and less temperature coefficient of resistance. Parmod™ ruthenate mixtures consist of ruthenium oxide powder or barium ruthenate powder and the ROM, for example ruthenium 2-ethylhexanoate which has a decomposition temperature of less than 300° C. A significant problem in making ruthenium Parmod™ mixtures is that ruthenium oxide itself is a powerful oxidant, and in the presence of organic material in the ROM it can ignite spontaneously.

Indium Tin Oxide Compositions

Mixtures of the semiconducting oxides of indium and tin have been used as the resistive phase with indium, tin and titanium MODs. Titanium oxide powder has been used as a nonconductive diluent to adjust the resistivity. Resistivities of 100 to 10,000 ohms per square per mil have been achieved. Examples of indium, tin and titanium MOD compounds, indium 2-ethylhexanoate, tin 2-ethylhexanoate and titanium dimethoxy dineodecanoate were synthesized as known in the art, and ink formulations were made as shown in Table 2 below.

TABLE 2

ITO Ink Compositions.

| Ink | Powder | MODs | | | NDA | α-terpineol |
|---|---|---|---|---|---|---|
| | | $In(2EH)_3$ | $Sn(2EH)_2$ | $Ti(OMe)_2(nd)_2$ | | |
| Sample 10 95:5 powder | 4.6 g ITO 95/5 (Arconium) | 5.4 g | 0.08 g | | 50 drops | 5 drops |
| Sample 11 98:2 MOD | 4.6 g ITO 95/5 | 5.4 g | 0.08 g | | 1.25 g | 5 drops |
| Sample 12 100:0 MOD | 4.6 g ITO 95/5 | 5.4 g | | | 1.0 g | 15 drops |
| Sample 13 Ti MOD | 4.6 g ITO 95/5 | | | 2.25 g | 0.5 g | 3 drops |
| Sample 14 50:50 ITO:TiO2 | 2.3 g ITO 95/5 2.3 g TiO2 | | | 2.25 g | 0.5 g | 3 drops |
| Sample 15 40:60 ITO:TiO2 | 2.3 g ITO 95/5 2.3 g TiO2 | | | 2.25 g | 0.25 g | 3 drops |

These mixtures were prepared by weighing out the ITO and $TiO_2$ powders, adding the indicated amount of the MOD compounds, the neodecanoic acid (NDA), and α-terpinol and blending by hand to obtain a smooth, screen printable composition.

The electrical properties of the ITO-based inks can be controlled through variations in the ink composition. As FIG. 3 shows, the resistivity can be varied over 3 orders of magnitude between <100 and 10,000 Ω/sq/mil. The lower resistivity ink (Sample 13), contains the ITO 95/5 powder with only the titanium MOD. The addition of increasing amounts of $TiO_2$ powder to the composition gradually increases the resistivity up to 10,000 Ω/sq/mil. Higher values can be achieved with higher amounts of $TiO_2$. At 10,000 Ω/sq/mil these compounds can furnish resistors which cover 75% of the required components in a square format and 98+% of the requirement in a 1×10 format. These requirements are discussed in "Evaluating the Need for Integrated Passive Substrates", Kapadia, H.; Cole, H.; Saia, R.; Durocher, K.; Advancing Microelectronics, Jan/Feb. 1999 p 12–15.

The use of the Ti MOD compound means that a temperature of >350° C. may be necessary for complete decomposition. The application of laser annealing can reduce the required temperature. These films consolidate well, with fair to good tape tests, and have good adhesion to glass, for example.

High-K Dielectrics (Ferroelectrics)

The ferroelectric class of ceramic oxide materials are piezoelectric. They change shape when an electric charge is placed upon them, and they generate an electric charge when they are mechanically distorted. They also have dielectric constants in the thousands compared to familiar polymers and glasses that have dielectric constants less than ten. The ferroelectrics, typified by barium titanate and lead zirconate/titanate (PZT), are used as the dielectric in ceramic capacitors because they can provide high capacitance values in a small area They are also used for nonlinear optics devices and display birefringence.

Conventional ferroelectrics are made by solid state reactions between, for example, barium oxide and titanium dioxide at 1000–1200° C. (see, e.g., AJ Moulson. and JM Herbert, *Electroceramics*, 1990, Chapman and Hall, London, Ch. 5 and 6). To make a Parmod™ mixture powdered ferroelectric can be mixed with either a sol of ferroelectric material or MOD compounds which can decompose to a ferroelectric.

The sol gel approach starts with alkoxides of barium and titanium which are synthesized and mixed in the appropriate proportions under completely anhydrous conditions. The mixture is then hydrolyzed to a sol with a trace of moisture and an acid or basic catalyst as needed. The sol can be mixed with barium titanate powder, printed to form capacitor dielectrics or other ferroelectric devices, and cured thermally to bond the powder together into a monolithic device. Attempts to use this approach have produced thin and blistered films. The cure temperature required to produce good dielectric films is too high for the bulk of polymer substrates.

In the MOD approach to Parnod™ ferroelectrics, barium titanate powder is mixed with barium neodecanoate and titanium dimethoxy dineodecanoate, printed on a polymer substrate and thermally cured. Such mixtures of MOD compounds have been successfully cured to provide dielectric constants of 2000–3000 at a temperature of 350° C.

Composition of Ferroelectric Inks

Barium neodecanoate, $Ba(nd)_2$, Lead 2-ethylhexanoate, $Pb(2-et)_2$, zirconium neodecanoate, $Zr(nd)_4$, and titanium dimethoxy dineodecanoate, $Ti(OMe)_2(nd)_2$, have been synthesized for use as ferroelectric ink components. The compositions of sample ferroelectric inks are shown in Table 3.

TABLE 3

Ferroelectric Inks

| Ink | $BaTiO_3$ Powder | Polymeric Precursor | MOD Compounds | NDA | α-terpineol |
|---|---|---|---|---|---|
| Sample 20 | Alfa <2 μm 4.0 g | | $Ba(nd)_2$, 0.50 g $Ti(OMe)_2(nd)_2$, 0.47 g | 0.5 g | 3 drops |
| Sample 21 PTO 4:1 | Degussa 4.0 g | | $Pb(2EH)_2$, 0.50 g $Ti(OMe)_2(nd)_2$, 0.46 g | 0.5 g | |
| Sample 22 polyester | Degussa 1.6 g | 1.6 g ethyl acetate | polyester resin 0.4 g | | |

Barium Titranate (BTO) Powder in Resin as a Standard: Ink (Sample 22)

A suspension of BTO powder in a polyester resin was tested as a standard against which to compare the Parmod™ m dielectrics such as Sample 20. The resin suspension was found to be as good a dielectric as a MOD matrix of BTO. Recent data on other resin-based dielectric systems have suggested that a dielectric constant of 60 can be achieved with such polymer thick film materials, Ink Sample 21

Ink Sample 21 was formulated with a 4:1 ratio of Degussa barium titanate powder to lead titanate MOD mixture. It provided improved performance vs. barium titanate/lead titanate mixtures. Lead titranate (PTO) MODs increased the resulting dielectric constant to more than 100 compared to 60 for BTO MODs. Because PTO crystallizes at about 470° C. versus 750° C. for BTO, it is easier to get it to provide a matrix with a high K. The only drawback is that PTO has a maximum K of about 300. The majority of the decomposition of the BTO MODs is completed by 400° C., but weight loss is seen up to 600° C. The PTO MODs decompose completely by about 300° C. Since the dielectric properties are dependent on the crystallinity (long range order) of the material, the lower decomposition and crystallization temperatures of the PTO material means that at 350–00° C., the PTO material formed have "longer range order" than the deposited BTO material, and thus have better properties.

Electrostatically Printed Silver Capacitors

Capacitors were made using PTO/BTO ink Sample 21 as the dielectric and electrostatically printed silver as the top and bottom electrodes on a glass substrate. The capacitors worked well giving capacitance's in the range of 1 –10 nF. The example capacitor was made completely from Parmod™ materials. Data on the dielectric constant and dissipation factor from 1–100 kHz are shown below. Dielectric properties as a function of cure conditions are shown in FIG. 3.

TABLE 4

Dielectric Constant and Dissipation Factor Data for Ink Sample 21 PTO/BTO

| Cure Temperature (° C.) | Cure Time (min) | Thickness (mil) | 1 KHz K | DF | 100 KHz K | DF | Breakdown Voltage (V) |
|---|---|---|---|---|---|---|---|
| 300 | 10 | 1.3 | 146 | 0.21 | 105 | 0.07 | >24 |
|  | 30 | 1.3 | 148 | 0.35 | 84 | 0.17 | >24 |
|  | 60 | 1.3 | 165 | 0.56 | 72 | 0.39 | >24 |
| 350 | 10 | 1.2 | 123 | 0.12 | 102 | 0.06 | >24 |
|  | 30 | 1.2 | 119 | 0.13 | 96 | 0.10 | >24 |
|  | 60 | 1.6 | 111 | 0.07 | 98 | 0.05 | >24 |
| 400 | 60 | 1.4 | 133 | 0.21 | 90 | 0.17 | >24 |
| 450 | 60 | 1.2 | 104 | 0.03 | 92 | 0.09 | >24 |

The range of dielectric constant at 300° C. suggests that cure temperatures above about 350° C. will be preferred to obtain reproducible performance.

Breakdown voltages were greater than 24 Volts for films of approximately 25 microns thickness, but in thinner films approaching 10 microns, the values were about 5 V. Ink Sample 21 with a PTO MOD system and a BTO powder meets the target requirement of a dielectric constant greater than 100 at a temperature low enough to be compatible with commonly used flex circuit substrates.

Ferrites

Ferrites are oxides with high magnetic permeabilities like iron and nickel metal but with no electrical conductivity. The corresponding lack of eddy current losses makes them suitable for magnetic components used at high frequencies. The general crystallographic classes of ferrites are spinels, hexaferrites and garnets. The hexaferrites and garnets are magnetically "hard" materials with high coercivities used as permanent magnets. The spinels, typified by magnetite $Fe_3O_4$ are soft magnetic materials used in transformers, chokes and antennas. Ferrites are made by decomposing the appropriate oxalates which are MOD compounds. A printable Parmod™ magnetite composition was made by mixing magnetite powder with iron oxalate. Finished ferrite components are then made by printing the mixture and decomposing the oxalate. The same general process can be followed to create other ferrite compositions with MOD compounds of iron, nickel and zinc.

In practice the oxalates proved ineffective as a ROM. Better results were obtained with ferric neodeacanoate as the MOD compound. The $Fe(neo)_3$ itself decomposes in an appropriate mixture of nitrogen, hydrogen and water vapor to a tightly adherent, well-bonded thin film. The atmosphere consisted of up to 10% hydrogen, at least 20% water vapor and the balance nitrogen in which magnetite is the sole stable iron species. The resulting black film is magnetic and electrically insulating. When mixed with $Fe_3O_4$ powder, a poorly-bonded thick film results with limited permeability. If the powder is prereduced in hydrogen, or if metallic iron powder is added, a well-bonded magnetic deposit is obtained but it is electrically conducting, A preferred composition uses a mixture of $Fe_3O_4$ powder, ferric neodecanoate and neodecanoic acid cured in an atmosphere that proceeds through stages which are slightly oxidizing, reducing, neutral and slightly oxidizing. Examples of ferrite mixtures are shown in Table 5.

TABLE 5

Ferrite Compositions, wt %

| Ink | Powder | Amount | MOD | Amount | Neo Acid | % Metal |
|---|---|---|---|---|---|---|
| Sample 31 | $F_3O_4$ | 62.3 | $Fe(neo)_3$ | 19.3 | 18.4 | 64.2 |
| Sample 32 | $F_3O_4$ | 61.7 | $Fe(neo)_3$ | 20.4 | 17.9 | 63.7 |
| Sample 33 | YIG | 61.7 | $Fe(neo)_3$ | 19.8 | 18.5 | 63.6 |
| Sample 34 | BaZnFeO | 61.7 | $Fe(neo)_3$ | 19.8 | 18.5 | 63.6 |

The processing sequence involved heating in wet nitrogen-hydrogen and then in nitrogen-hydrogen for a total of approximately 15 minutes to achieve consolidation by partial reduction to iron (stages 1 and 2 in Table 6). This was followed in some cases by heating in nitrogen and in all cases by a finishing step in a wet nitrogen-hydrogen mixture in which $Fe_3O_4$ is stable (stage 3 and Oxid. Gas). In some cases the oxidizing gas was air to oxidize the deposit to magnetite and hematite. The bulk of the results show consolidated deposits with magnetic properties and electrical conductivity somewhat less than handbook values for magnetite, in line with the porous nature of the deposits.

X-ray data on mixtures Sample 31 and Sample 32 before and after heat treatment are shown in Table 6 along with the composition of the furnace atmosphere as a function of time during the heat treatment. Mixtures, which are initially all magnetite, stay that way, unless treated in air (Sample 31-2). Conversion of magnetite to hematite increases electrical resistivity and reduces magnetic permeability drastically, as expected.

Treatment at 390° C. (Sample 32-1) results in somewhat higher electrical resistivity and somewhat lower magnetic permeability than treatment at 540° C. (Sample 32-2).

Micron sized magnetite powder was slurried with amyl acetate and deposited on a 1×10-cm test strip the inductance change was measured at 0.26. The best results with consolidated Parmod™ mixtures are a little short of twice as high, showing that, as with the ferroelectrics, the Parmod™ approach provides better performance than the same powder with an organic binder.

TABLE 4.2

X-ray Diffraction Data for Several Ferrite Inks.

| | Ink Sample | | | | | | | |
|---|---|---|---|---|---|---|---|---|
| | 31-1 | | 31-2 | | 32-1 | | 32-2 | |
| Comp. by x-ray | start | end | start | end | start | end | start | end |
| Fe | 3 | x | 3 | x | 3 | x | 3 | x |
| FeO | x | x | x | x | x | x | x | x |
| Fe2O3 | x | 5 | x | 23 | x | x | x | x |
| Fe3O4 | 97 | 95 | 97 | 77 | 97 | 100 | 97 | 100 |
| Gases | time (min) | Gas | time (min) | Gas | time (min) | Gas | time (min) | Gas |
| Process | | | | | | | | |
| Stage 1 | 1.5 | N2—H2—H2O | 1.5 | N2—H2—H2O | 1.5 | N2—H2—H2O | 1.5 | N2—H2—H2O |
| Stage 2 | 8.5 | N2—H2 | 8.5 | N2—H2 | 8.5 | N2—H2 | 8.5 | N2—H2 |
| Stage 3 | 10 | N2 | 10 | N2 | 10 | N2 | 10 | N2 |
| Oxid. Gas | 10 | N2—H2—H20 | 10 | Air | 10 | N2—H2—H2O | 10 | N2—H2—H2O |
| Temp, C. | 540 | | 540 | | 390 | | 540 | |
| Results | | | | | | | | |
| Resistance, ohms/cm | | 12 | | 43 | | 378 | | 231 |
| Induction Change | | 0.45 | | 0.08 | | 0.3 | | 0.39 |

Ink Sample 32 was formulated with larger particle size magnetite (Alfa—325 mesh, 97%). When the coarser powder was tested as a deposited slurry, the inductance change was 0.75, but after consolidation, the inductance change was only half as great, suggesting that the heat treatment may have damaged the powder.

Ink Sample 33 used Yttrium Iron Garnet (YIG) powder. The powder consisted of spherical 1–2 micron particles and was supplied by Particle Technologies Inc. The mechanical and magnetic properties of the deposited and processed films were no better than magnetite-based inks but the electrical conductivity was far lower, which should provide lower losses at high frequency.

Ink Sample 34 used—325 mesh Trans-Tech $Ba_2Zn_2Fe_{212}$ powder. The magnetic properties were not a s god as Sample 33, and the electrical conductivity was higher.

Printing Technology

Any convenient printing technology can be used to apply the mixtures of this invention. Screen printing and stenciling, as used with conventional thick film materials are good for limited production of high, quality rigid circuits. Individual components such as capacitors, resistors and inductive cores can be conveniently applied by dispensing with a hypodermic needle or the MicroPen. Gravure printing is suitable for roll to roll printing on flexible substrates at high speeds and with high resolution. Ink jet printing is suitable for computer controlled printing with moderate resolution and speed. Electrographic printing can provide higher resolution and higher speed. All of these methods can be used with Parmod™ compositions, including conductors and oxides.

What is claimed is:

1. A composition of matter comprising a reactive organic medium and a particulate metal oxide or mixture of oxides, wherein said composition can be heated to consolidate to a monolithic pure metal oxide.

2. The composition of claim 1 wherein said composition can be consolidated at a temperature below about 450° C.

3. The composition of claim 1 wherein said reactive organic medium is selected from the group consisting of one or more metallo-organic decomposition compounds, one or more reactive compounds which can react with said metal oxide mixture to produce metallo-organic decomposition compounds, and mixtures thereof.

4. The composition of claim 1 wherein said reactive organic medium comprises one or more compounds having a weak heteroatom bond to a metal, said heteroatoms being selected, independently from one another, from the group consisting of O, N, S, P Cl, Br, I and As.

5. The composition of claim 1 wherein said metal oxide is an oxide of a metal, said metal being selected from the group consisting of a metal from group IIA, IIIA, IVA, VA, VIA, VIIA, VIIIA, IIB or IIIB, copper, boron, aluminum, silicon, germanium; tin; lead; arsenic; antimony; bismuth; selenium; tellurium; and the lanthanide rare earths.

6. A method for producing electrical components on a substrate comprising the steps of
  A) printing an composition in one or more patterns of electronic components, said composition comprising a reactive organic medium and a metal oxide mixture;
  B) curing the mixture to produce well-consolidated oxide electronic components.

7. The method of claim 6 wherein said substrate is a polymer-based printed circuit substrate.

8. The method of claim 6 wherein said substrate is selected from the group consisting of polyimides, epoxy-glass laminates and high temperature electronic dielectric materials.

9. The method of claim 6, wherein said composition is porinted using a process selected from the group consisting of screen printing, stenciling, dispensing, gravure printing, ink jet printing, electrographic printing, letterpress printing, and offset printing.

10. The method of claim 6 wherein said composition is thermally cured.

11. The method of claim 10 wherein said curing step B) is performed at a temperature below about 450° C.

12. The method of claim 6 wherein said composition is cured in step B) by applying radiant energy such that the composition is heated to a higher temperature than the substrate.

13. The method of claim 12 wherein said radiant energy is infrared radiation or laser radiation.

14. The method of claim 6 wherein said curing step B) is performed in a controlled atmosphere comprising Nitrogen, Oxygen, Hydrogen, water and mixtures thereof.

15. The method of claim 14, wherein the composition of said controlled atmosphere is varied during the curing step B).

16. A resistor on a substrate produced by the steps comprising:
  A) printing an composition in the patterns of the resistor on the substrate, said composition comprising a reactive organic medium and a metal oxide mixture;
  B) curing the mixture to produce well-consolidated oxide resistor.

17. A capacitor on a substrate produced by the steps comprising:
  A) printing an composition in the patterns of the capacitor on the substrate, said composition comprising a reactive organic medium and a metal oxide mixture;
  B) curing the mixture to produce well-consolidated oxide capacitor.

18. An inductor on a substrate produced by the steps comprising:
  A) printing an composition in the patterns of the inductor on the substrate, said composition comprising a reactive organic medium and a metal oxide mixture;
  B) curing the mixture to produce well-consolidated oxide inductor.

* * * * *